(12) United States Patent
Dudek et al.

(10) Patent No.: US 7,078,324 B2
(45) Date of Patent: Jul. 18, 2006

(54) METHOD OF FABRICATING A SEMICONDUCTOR COMPONENT WITH ACTIVE REGIONS SEPARATED BY ISOLATION TRENCHES

(75) Inventors: Volker Dudek, Brackenheim (DE); Michael Graf, Leonberg (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 10/945,720

(22) Filed: Sep. 20, 2004

(65) Prior Publication Data

US 2005/0064678 A1    Mar. 24, 2005

(30) Foreign Application Priority Data

Sep. 19, 2003  (DE) ................ 103 45 346

(51) Int. Cl.
  *H01L 21/425*  (2006.01)
(52) U.S. Cl. ...................... 438/524; 438/197
(58) Field of Classification Search ........... 438/197, 438/270, 427, 524, 589
  See application file for complete search history.

(56) References Cited

U.S. PATENT DOCUMENTS

| | | | |
|---|---|---|---|
| 4,472,240 A | 9/1984 | Kameyama | |
| 5,341,011 A | 8/1994 | Hshieh et al. | |
| 5,504,033 A | 4/1996 | Bajor et al. | |
| 5,536,675 A * | 7/1996 | Bohr | .............. 438/427 |
| 6,137,152 A | 10/2000 | Wu | |
| 6,242,788 B1 | 6/2001 | Mizuo | |
| 6,294,419 B1 * | 9/2001 | Brown et al. | .............. 438/221 |
| 6,316,299 B1 | 11/2001 | Tung | |
| 6,524,903 B1 | 2/2003 | Ootsuka et al. | |
| 6,780,713 B1 | 8/2004 | Bromberger et al. | |
| 2002/0113267 A1 | 8/2002 | Brown et al. | |
| 2003/0116819 A1 | 6/2003 | Hokazono | |
| 2005/0095804 A1 | 5/2005 | Dietz et al. | |

FOREIGN PATENT DOCUMENTS

| | | |
|---|---|---|
| DE | 69430768 | 11/2002 |
| DE | 10131705 | 1/2003 |
| EP | 0 880 174 | 11/1998 |
| EP | 0 948 044 | 10/1999 |
| JP | 63 144540 | 6/1988 |
| WO | WO03 046977 | 6/2003 |

* cited by examiner

*Primary Examiner*—Phuc T. Dang
(74) *Attorney, Agent, or Firm*—W. F. Fasse; W. G. Fasse

(57) ABSTRACT

To form a semiconductor component having active regions separated from one another by trenches as isolation structures, a method involves forming a shallow trench in a semiconductor body, thereafter forming a deep trench within the shallow trench in the semiconductor body, and thereafter completely driving dopant atoms into the semiconductor body to form a well region doped with the dopant. The dopant may be previously introduced by implantation into a surface layer, and then the dopant is finally completely driven into the well region by thermally supported diffusion after forming the deep trench. The shallow and deep trenches together form a compound trench with stepped side walls. Two oppositely doped wells may be formed on opposite sides of the compound trench, which thus isolates the two wells from one another. Active regions may be formed in the two wells.

27 Claims, 2 Drawing Sheets

METHOD OF FABRICATING A SEMICONDUCTOR COMPONENT WITH ACTIVE REGIONS SEPARATED BY ISOLATION TRENCHES

PRIORITY CLAIM

This application is based on and claims the priority under 35 U.S.C. §119 of German Patent Application 103 45 346.6, filed on Sep. 19, 2003, the entire disclosure of which is incorporated herein by reference.

FIELD OF THE INVENTION

The invention relates to a method of fabricating a semiconductor component or element that has active regions separated from one another by isolation structures in the form of shallow and deep trenches.

BACKGROUND INFORMATION

A method of the above mentioned general type is known from U.S. Pat. No. 5,504,033 (Bajor et al.), the disclosure of which is incorporated herein by reference for background.

In integrated circuits made of semiconductor material, active regions are separated and isolated from one another by so-called field regions. Examples of the active regions include individual transistors that are integrated into the same common substrate. The field regions are provided with insulating or isolating structures in order to avoid an undesired drift of charge carriers, i.e. electrons or holes, between the respective active regions. In integrated circuits based on silicon technology, it is known to isolate respective active regions on the surface of the circuit or device from each other by means of an isolating or insulating structure consisting of a silicon oxide (e.g. silicon dioxide), generally called a field oxide.

The insulation or isolation structure may, for example, be produced by means of the LOCOS (LOCal Oxidation of Silicon) technology, which involves the following process. First, the active regions of the circuit are covered by a structured or patterned silicon nitride layer. Next, the entire surface is oxidized. Since the conversion rate of silicon nitride into silicon dioxide amounts to only about 1% of the growth rate of the oxide on the uncovered (i.e. exposed) field regions of the integrated circuit, the isolation structure of silicon oxide grows preferentially in the field regions or field areas between the active regions of the integrated circuit.

A problem existing in the LOCOS technology relates to the formation of a so-called bird's beak structure characterized by a tapering or thinning of the oxide layer as well as an associated bird's head peak or ridge along the edge or perimeter of the nitride layer. This bird's beak structure arises as a result of a diffusion of oxidizing gases under the perimeter edge of the nitride layer. As a result, after the nitride layer is removed, there arises a gradual transition rather than a clean distinct boundary from the field oxide to the adjacent active region. The width and shape of the bird's beak structure determine the minimum spacing distance of neighboring active regions, and thus limit the achievable packing density of the active regions in the integrated circuit.

A further possibility for insulating or isolating active regions relative to one another is provided by the so-called STI (Shallow Trench Isolation) technology, whereby trenches are formed by an anisotropic etching process between active regions that have been covered with a nitride protective layer, and then the trenches are filled with an insulating material such as silicon dioxide or polysilicon. In this context, a trench is regarded as shallow in the sense of "Shallow Trench Isolation" if it has an aspect ratio, i.e. a ratio of trench depth to trench width, that is smaller than 1. Using STI technology, it is possible to achieve a higher packing density in comparison to the results of LOCOS technology.

In order to insulate or isolate active regions in the depth of the structure of the integrated circuit from one another, it is known to use so-called deep trenches and/or so-called wells or well regions for achieving the lateral isolation. A deep trench is characterized by an aspect ratio greater than 1, i.e. the trench is deeper than it is wide. A well is a three-dimensional region or portion of a semiconductor substrate, having majority charge carriers of a different conductivity type (for example P-type) in comparison to the majority charge carriers of the surrounding portion of the substrate around the well (for example N-type). As a result, blocking or non-conductive PN-junctions will be formed along the peripheral edges or boundaries of the wells, in connection with a suitable electrical reverse-biasing thereof, whereby these PN-junctions effectively electrically isolate the interior of the well from the surroundings thereof.

Such wells are typically produced through implantation of a dopant followed by thermally supported diffusion of the dopant into the semiconductor substrate. Since the diffusion is generally not directional, i.e. does not proceed along a preferred direction, the drive-in diffusion typically occurs both in the depth direction as well as in the width or lateral direction. Thus, the lateral spreading of the wells will become ever greater as the wells are diffused or driven deeper into the semiconductor substrate such as silicon, by a high temperature well drive step. In other words, as the dopant is diffused deeper into the substrate, it necessarily also spreads wider in the lateral direction. As a result, the mutual electrical influence or interference of adjacent wells on each other will also increase. Thus, the spacing distance between adjacent electrically active regions with different well dopings must be selected to be sufficiently large to prevent or avoid such an electrical influence between neighboring wells. A desired doping depth necessarily also always requires an associated certain width, which ultimately leads to undesired limitations of the packing density. Similar limitations arise in an analogous manner in connection with high dopant concentrations.

SUMMARY OF THE INVENTION

In view of the above, it is an object of the invention to provide a method of fabricating semiconductor components or especially integrated circuits with active regions isolated from one another, whereby the above mentioned limitations are avoided or at least reduced. The invention further aims to avoid or overcome the disadvantages of the prior art, and to achieve additional advantages, as apparent from the present specification. The attainment of these objects is, however, not a required limitation of the claimed invention.

The above objects have been achieved according to the invention in a method of fabricating a semiconductor component that has active regions as well as isolation structures in the form of shallow trenches and deep trenches separating or isolating the active regions from one another. According to the invention, the method includes a step of forming the shallow trench(es) in a semiconductor substrate, thereafter forming the deep trench(es) so as to extend within or in registration with the shallow trench(es), providing (e.g.

implanting) dopant atoms into the semiconductor substrate, and then (at the earliest after the step of forming the deep trenches) completely driving (e.g. diffusing) the dopant atoms into the semiconductor substrate so as to form wells or well regions in the semiconductor component. The key features of the inventive method are thus that the deep trenches are formed after the shallow trenches, that the deep trenches are formed to run or extend along or within the shallow trenches, and that the complete drive-in diffusion of the dopant atoms by means of a thermally supported diffusion to produce the wells in the semiconductor component is carried out, at the earliest, after the formation of the deep trenches.

In this manner, i.e. with the above mentioned inventive features, the lateral diffusion of the well dopants is limited by the trench structures. For that reason, relatively small well regions with high dopant concentrations and/or dopant concentrations penetrating deep into the volume of the semiconductor substrate can be produced, without giving rise to an undesired lateral diffusion that would otherwise cause a mutual cross-doping or other undesired influence along the lateral boundaries of the wells. Particularly, such an undesired lateral diffusion is prevented by the interposed trenches. While the deep trenches provide an effective lateral isolation and separation in the depth of the semiconductor substrate, the shallow trenches, which are shallower and wider than the deep trenches, have a relatively large width so as to provide a good isolation of the active regions at the surface of the semiconductor substrate. In view of the above, the combined forming of the deep trenches and the shallow trenches thus results in a stepped compound trench structure having a deeper and narrower trench portion as well as a shallower and wider trench portion.

If a deep trench is etched before carrying out high temperature steps of a well dopant diffusion drive, the problem fundamentally arises, that defects can be generated along the periphery or boundary of the isolation trench due to the high thermal loading. Such defects later lead to undesired high leakage currents in the operation of the fabricated device. It has been determined that the inventive method, in which the deep trenches are formed after the shallow trenches and particularly to extend within the shallow trenches, achieves a significant reduction of this problem. It is considered possible that this problem is reduced by omitting a high topography step, which would otherwise arise in connection with deep trenches that do not extend within shallow trenches according to the invention.

The inventive features of the time sequence of the steps and the associated topology of the trenches thus have a mutual or reciprocal interaction with one another. Namely, it is this inventive time sequence of the trench formation steps as well as the specific topology and topography of the trench configuration, location, and combined extension, that make it possible to carry out a well dopant drive through at least one high temperature drive step after the formation of the deep trenches, with a reduced occurrence of thermally induced defects along the trenches and thus a reduced occurrence of undesired leakage currents in the final operation of the device.

Preferably according to the invention, the diffusion of the dopant atoms is controlled in such a manner so that the wells are at least partially bounded by the deep trenches and/or the shallow trenches. As a result of this measure, the lateral boundaries of a well are no longer defined only by the relatively imprecise or "fuzzy" and unpredictable extent of the lateral diffusion. Instead, the lateral boundary can be exactly defined and prescribed by the location and course or extension of the trenches. As a result, a wafer surface area, for example the surface area of a silicon wafer disk, can be better and more fully utilized. Especially, the inventive method provides the possibility to select or adjust the lateral spacing distance between various different active regions in various different doped wells independently of the respective dopant concentration and the depth of the wells.

It is also preferred according to the invention that the deep trenches are produced in such a manner so that their depth is at least as large as the depth of the wells. Thereby, the wells are separated and isolated from one another in a defined manner not only at the surface, but also in the volume of the semiconductor substrate.

In another preferred feature of the invention, in which a semiconductor component is formed in a silicon volume or substrate on an insulating layer, the deep trenches and the wells extend downwardly through the depth of the silicon volume all the way to the insulating layer. Thereby, a perfect and complete isolation of the active regions is achieved both laterally and to the bottom. Moreover, extending the wells down to an insulating intermediate layer of an SOI (Silicon On Insulator) wafer, in connection with the small thickness of the semiconductor substrate, provides the advantage that parasitic capacitances are suppressed.

A further preferred embodiment of the invention is characterized in that the shallow trenches are formed by an STI process. In comparison to the formation of an isolation structure through a LOCOS technology, the STI process provides the advantage that no bird's beak structures arise along the edge or perimeter of the field oxide. As mentioned above, such bird's beak structures are caused by under-diffusion and result in an effective loss of useful surface area. Thus, the use of the STI technique makes it possible to achieve a higher component packing density through a reduced loss of useable surface area.

It is further preferred that the shallow trenches and the deep trenches are provided in common with an insulation, for example a liner oxide layer or a filling-insulation produced by filling the trenches with an oxide or with polysilicon. Due to the common filling of both the deep trenches and the shallow trenches, it is possible to omit extra mask steps that would otherwise be necessary for achieving a separate filling of the different trenches. As a result, the inventive fabrication process is simplified and rationalized, and thereby achieves economic and time advantages.

A further preferred embodiment is characterized in that walls of the trenches are provided with a liner oxide layer before filling the trenches with an insulator. In this regard, a liner oxide is a thin oxide layer provided on the surface of the trench surfaces or boundaries. On the one hand, the provision of a liner oxide in this manner achieves the advantage of contributing to the rounding-off of edges of the trench structures, and thereby achieving a stable interface between the semiconductor substrate and the trench structures. This feature would also be provided by thicker oxides. On the other hand, and additionally, the use of a thin liner oxide provides the further advantage that the oxide layer is so thin that no defect lines produced by mechanical stress are generated. Thus, the high leakage currents that would otherwise arise due to such defect lines can be avoided.

It is also preferable according to the invention, that the dopant atoms are initially introduced into the semiconductor substrate through ion implantation, and only later are fully driven into the substrate through a thermally supported diffusion. The introduction of dopant atoms by means of ion implantation is a conventionally utilized, tested, and proven technique in order to introduce dopant atoms with a well-defined concentration and a reproducible high accuracy into a semiconductor substrate. The time-separation of the complete drive-in diffusion from the implantation makes it possible to interpose the above mentioned steps of forming the trenches.

A preferred process sequence of the method according to the invention includes the following steps: defining well regions by applying a structured or patterned hard mask on a semiconductor substrate; implanting dopant atoms of different polarity in various different adjacent or adjoining regions, whereby respectively a dopant of one given polarity is implanted into a respective single region; forming shallow trenches between respective well regions of different polarity; forming deep trenches extending along within the shallow trenches; forming thin oxide layers on the surfaces of the trenches; driving in the implanted dopants through a thermally supported diffusion process; and then filling the trenches with an insulating material. This combination and sequence of process steps provides a particular embodiment of the invention that combines most of the above discussed advantages. The recitation of these process steps is not closed and strictly limited to the specifically recited steps. To the contrary, for example, additional steps such as masking steps, cleaning steps and/or further element formation steps can additionally be provided before, between, or after any of the above mentioned steps.

Further advantages of the invention are apparent from the remainder of the specification and the accompanying drawings. It should be understood that the characteristics and features of the invention disclosed herein cannot only be used in the disclosed combination or combinations, but also in other combinations or individually while remaining within the scope of the present invention.

BRIEF DESCRIPTION OF THE DRAWINGS

In order that the invention may be clearly understood, it will now be described in connection with an example embodiment thereof, with reference to the accompanying drawings, wherein.

DETAILED DESCRIPTION OF A PREFERRED EXAMPLE EMBODIMENT AND OF THE BEST MODE OF THE INVENTION

Figure 1:
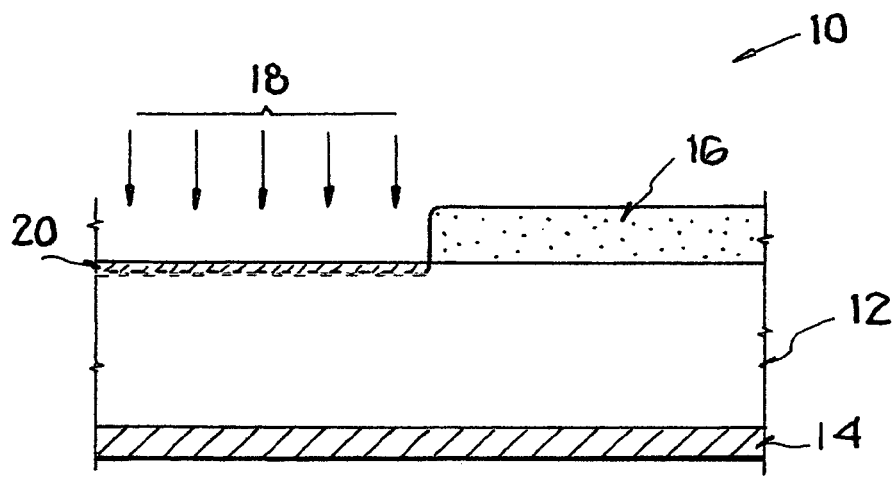
FIG. 1 is a schematic sectional view of a semiconductor substrate during an implantation of a first dopant for defining a first well.

FIG. 1 schematically shows a cross-section of a portion of a semiconductor body 10 comprising a semiconductor substrate 12 on an insulating intermediate layer or isolating layer 14. A typical example of such a semiconductor body 10 is represented by a "Silicon On Insulator" (SOI) wafer. In this regard, the insulating intermediate layer 14 is typically realized as a silicon dioxide layer.

For fabricating a semiconductor device or component, respective well regions 42, 44 (see FIG. 6) with different conductivity type will be formed in the semiconductor body 10. To form these well regions with respective different conductivity of the respective majority charge carriers, different partial regions of the semiconductor substrate 12 will respectively be doped with dopants of different valence, so that the different conductivity types result in the respective well regions. To achieve a P-type conductivity, a four-valent semiconductor substrate material such as silicon, for example, is doped with boron atoms, which are incorporated as three-valent substitution defect sites in the silicon lattice, and which act as electron acceptors. Analogously, an N-type conductivity is achieved by doping, for example, a four-valent semiconductor substrate with arsenic or phosphorous atoms, which are incorporated as five-valent substitution defect sites in the basic crystal lattice formed of four-valent silicon atoms, and which act as electron donors.

For spatially defining the areas of the semiconductor substrate 12 in which the well regions to be formed, one or more masks are used. For example, areas that are not be doped with a first dopant that will form the first well 42 are covered by a mask 16 as shown in FIG. 1. The mask 16 is patterned and/or provided with openings in any conventionally known manner. Basically in principle, the dopants can be introduced into the regions of the semiconductor substrate 12 not covered by the mask 16 either by a diffusion technique or by an ion beam implantation. In modern semiconductor device fabrication processes, the ion beam implantation is generally preferred, whereby an exactly controlled quantity of dopant atoms is initially ionized uniformly and accelerated to a defined ion velocity to form an ion beam 18 of the ionized dopant atoms as indicated schematically by the arrows in FIG. 1.

The ion beam 18 of dopant ions impinges on areas of the semiconductor substrate 12 not covered by the mask 16. The dopant ions then penetrate into the crystal lattice of the semiconductor substrate material. There, the ions are retarded or decelerated until coming to a stop and respectively being received at a substitution defect site within the lattice. The penetration depth of the respective ions into the semiconductor substrate 12 depends on the kinetic energy of the ions in the ion beam 18, as well as other factors such as the composition, crystal structure, crystal orientation, and the like of the semiconductor substrate 12. Due to the release of energy from the ions as they penetrate into the semiconductor crystal lattice, the ions damage the crystal lattice structure and typically come to rest at respective interstitial lattice locations. This implantation step forms a surface layer 20 of the semiconductor substrate 12 having the dopant ions implanted and doped therein.

Due to the above mentioned lattice damage of this surface layer 20 caused by the ion implantation, it is then necessary to carry out a thermal annealing, curing and activating step at an elevated temperature in order to remove or repair the defects or crystal damage, and to relocate the dopant atoms as much as possible to lattice sites. It is a significant characterizing feature of the present invention, that these thermal annealing and activating steps are not performed directly after the implantation, but rather only after further structuring steps have been carried out.

In FIG. 1, the relatively thin surface layer 20 is the surface layer of the semiconductor substrate 12 that has been enriched with dopant atoms through the preceding implantation. In that regard, the sectional hatching of the layer 20, with diagonal lines extending from the bottom left to the top right, represents a particular conductivity type of the dopant, for example a P-type conductivity. Also, the relatively dense or close arrangement of the sectional hatch lines represents a relatively high dopant concentration.

Figure 2:
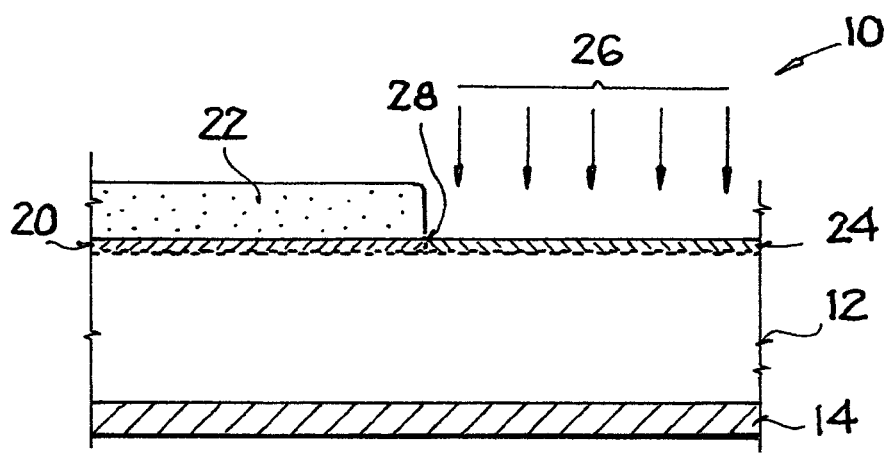
FIG. 2 shows the semiconductor substrate of FIG. 1 in a further step of implanting a second dopant for defining a second well.

After the above-described first implantation of first P-type dopant atoms into the surface layer 20, a second masking step and implantation are to be carried out to form a second surface layer 24 of opposite conductivity (e.g. N-type) for later defining the second well 44. In this regard, FIG. 2 shows the semiconductor body 10 of FIG. 1 during such a further second implantation step. A second mask 22 has been applied to cover the first surface layer 20 and any other areas of the substrate that are not to be affected by the second implantation. Then, the second ion implantation is carried out with a second dopant ion beam 26 through the open or exposed area of the second mask 22 to form the second surface layer 24 doped with implanted ions of the second conductivity type, e.g. N-type, which is represented by the diagonal sectional hatch lines extending from the upper left to the lower right in the surface layer 24 in FIG. 2. The second doped or implanted surface layer 24 may directly adjoin the first surface layer 20 at a junction or boundary line 28. This is achieved by appropriately successively positioning the two masks 16 and 22 up to and on opposite sides of this boundary line 28. Alternatively, an un-implanted region or spacing distance could be left between the two surface layers 20 and 24.

The masks 16 and 22 used for spatially limiting and defining the implantation steps as discussed above, i.e. for covering the areas that are not to be doped, can be made of any dielectric material or materials, such as silicon oxide and silicon nitride for example, that are also known for use in connection with diffusion techniques. However, the ion deceleration or retardation in solid bodies, in contrast to the diffusion process, is not a thermodynamic, but rather essentially a mechanical process. Thus, essentially any material that achieves such a mechanical blocking, deceleration or retardation of the ions can be used for the ion implantation mask. Since high temperatures do not arise during the ion implantation, it is especially possible to use a photographically exposed and developed photoresist layer as the material of the respective mask 16 or 22, i.e. as a protective layer to block the ion beam and prevent ion implantation therethrough, to spatially limit and define the areas of ion implantation. Since no separate elevated temperature steps are needed for producing protective layers in connection with a mask 16 or 22 consisting of photoresist, as would otherwise be necessary in connection with the deposition of oxides and/or nitrides for example, the total wafer processing time and the thermal loading of the wafers are minimized.

For the above reasons, the masks 16 and 22 are preferably defined lithographically as photoresist layers. Through an etching step, the exposed or unexposed resist window areas are etched free to the surface of the semiconductor substrate 12. Next, the exposed surface of the semiconductor substrate 12 is covered with a scattering oxide, and then the doping is carried out by means of the ion implantation as described above.

As an alternative to the above described process, the semiconductor body 10 is first coated, in a LOCOS process, with a wet-formed (i.e. wet-oxidized) oxide layer, which will later serve as an implantation mask during the doping of the well regions. The isolation structure in this regard is, for example, produced using the LOCOS technology. The well regions are lithographically defined with masks in a photoresist layer. A wet chemical etching step opens the oxide in the resist windows down to the silicon surface. After covering the free or exposed silicon surface with a scattering oxide, a doping is carried out through ion implantation.

The above described ion implantation steps result in the arrangement or stage shown in FIG. 2. Note that there is a junction or boundary line 28 between the first surface layer 20 that was implanted with the first dopant through the first ion implantation 18 in the first implanting step of FIG. 1, and the second surface layer 24 that was implanted with the second dopant through the second ion implantation 26 shown in FIG. 2. This junction or boundary point 28 between the two surface layers 20 and 24 is defined by the location of the edge of the two masks 16 and 22 as discussed above. Alternatively, a spacing distance could be provided between the two implanted surface layers 20 and 24.

In any event, the next step involves applying a hard mask 30 (not shown in FIG. 2), for example consisting of silicon nitride, having an opening 32 (see FIG. 3) arranged over the junction or boundary line 28 between the two surface layers 20 and 24. This hard mask 30 is then used for forming a trench 34, and particularly a shallow trench 34 (see FIG. 3) through the mask opening 32. Thus, the trench 34 is formed in the semiconductor substrate 12 directly along, encompassing, and removing, the junction or boundary line 28 between the two implanted or doped surface layers 20 and 24. As a result, any area of poorly defined dopant concentration along the edges of the surface layers 20 and 24, e.g. along the boundary line 28, is removed, and the remainder of the surface layers 20 and 24 each have a precisely defined edge along a sidewall of the trench 34.

The formation of the trench 34 may be carried out by means of an anisotropic STI (Shallow Trench Isolation) etching process. Such an STI etching process involves anisotropic etching of the trench 34 between the regions or areas covered with the nitride protective layer 30 (FIG. 3), and then later filling the trench 34 with an insulating material such as silicon dioxide or polysilicon. In connection with STI processes, and in the context of the present application, a trench is regarded as a shallow trench if it has an aspect ratio, i.e. a ratio of the trench depth to the trench width, less than one.

Figure 3:
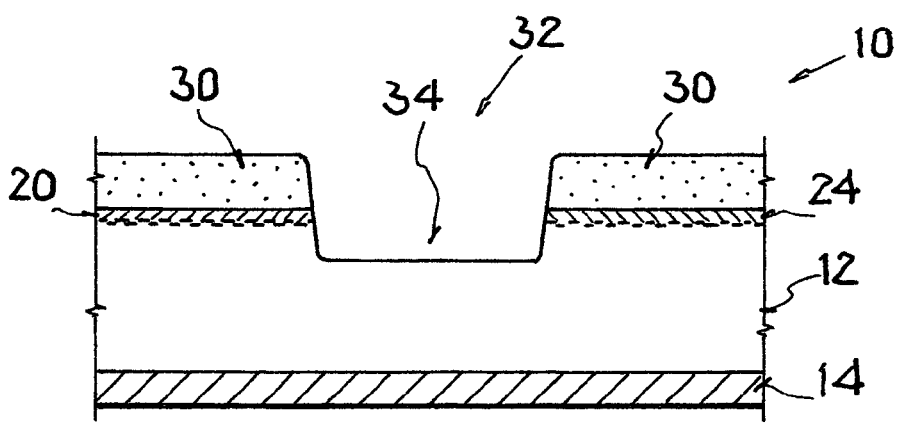
FIG. 3 shows the semiconductor substrate after a further step of carrying out an STI etching to form a shallow trench.

FIG. 3 shows the semiconductor body 10 with the trench 34 having been formed in the semiconductor substrate 12, but not yet filled with an insulating material. The trench 34 provides a clearly defined spacing distance between the first implanted or doped surface layer 20 and the second implanted or doped surface layer 24. Moreover, as mentioned above, the etching-removal of material to form the trench 34 removes any doping imprecisions that could have been caused by an overlapping of the masks 16 and 22 used for the preceding implanting steps (FIGS. 1 and 2).

Figure 4:
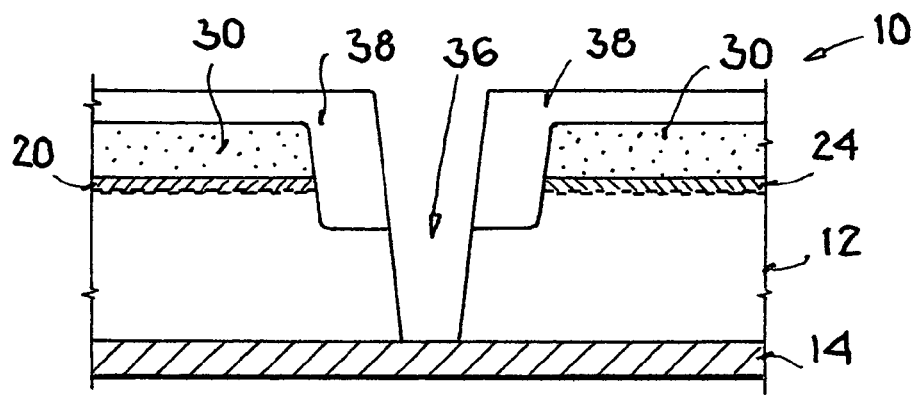
FIG. 4 shows the semiconductor substrate after a further step of forming a deep trench by etching.

Next, proceeding from the state shown in FIG. 3 to the state shown in FIG. 4, the inventive method involves forming a deep trench 36 within and along the shallow trench 34, and preferably in the middle of the bottom of the shallow trench 34. If the semiconductor body 10 is embodied as an SOI (Silicon On Insulator) wafer with a silicon substrate 12 on an insulating intermediate layer 14, the deep trench 36 preferably reaches downwardly entirely through the silicon substrate 12 to the insulating intermediate layer 14. For forming the deep trench 36, a further mask step involves arranging or providing a further mask 38 in a self-adjusting manner on the mask 30 that was used for the STI etching of the shallow trench 34 in the preceding step, and that remains in place. This ensures the proper positioning or registration of the deep trench 36 with the shallow trench 34. The mask 38 fills the previously formed shallow trench 34, except for the opening of the mask 38, so as to prevent further etching of the shallow trench 34 while forming the deep trench 36.

Figure 5:
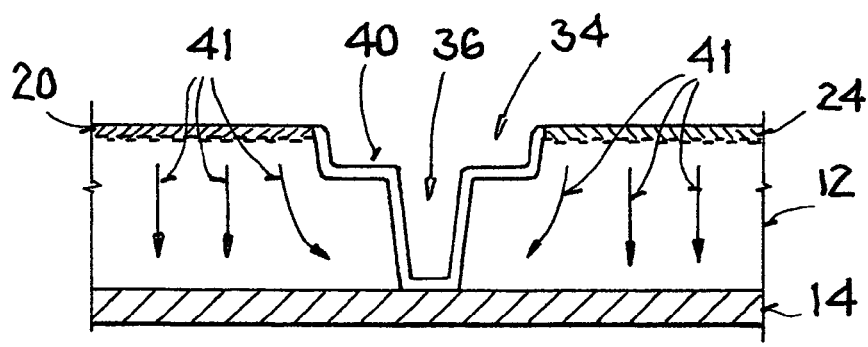
FIG. 5 shows the semiconductor substrate after a further step of forming a liner oxide on the boundary surfaces of the combined trench.

The formation of the deep trench 36 within the shallow trench 34, as mentioned above, considerably reduces the risk of a subsequent generation of defect sites along the periphery of the deep trench in subsequent high temperature steps. Additionally, this risk can be further reduced by forming a thin oxide layer, and particularly a so-called liner oxide 40, on the surfaces of the resulting composite or compound trench structure 34, 36. This liner oxide 40 may be applied or provided after removing the masks 30 and 38, for example as shown in FIG. 5. As can be seen, the resulting composite or compound trench structure 34, 36 includes both the shallow trench 34 and the deep trench 36 together forming a single trench with stepped sloping sidewalls and with a shoulder or step at a transition from the shallow trench 34 to the deep trench 36.

Only after the compound trench structure 34, 36 has been completed and covered with the liner oxide 40 as shown in FIG. 5, then a high temperature step is carried out to perform a complete drive-in diffusion of the respective dopants that had been surface-implanted into the doped surface layers 20 and 24, such that the thermally supported diffusion now drives the dopants into the depth of the semiconductor substrate 12. The arrows 41 in FIG. 5 represent the drive-in diffusion of the dopant quantity that has been, in effect, pre-supplied and stockpiled or reserved in the doped surface layers 20 and 24, into the depth of the semiconductor substrate 12.

Figure 6:
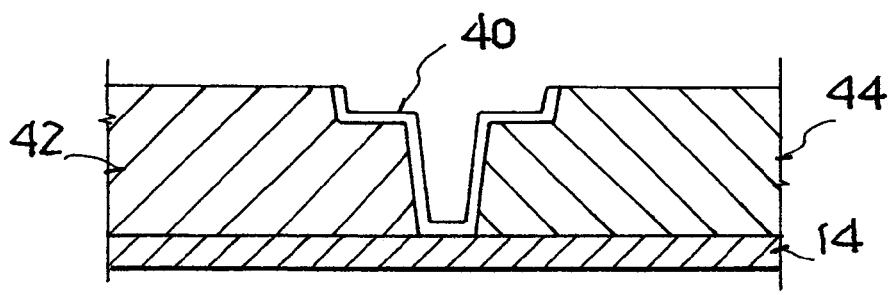
FIG. 6 shows the semiconductor substrate in a state following the drive-in diffusion of the dopants by means of a thermally supported diffusion process.

The result of the high temperature step for performing the drive-in diffusion 41 according to FIG. 5, namely the wells 42 and 44 produced thereby, are shown in FIG. 6. The cross-sectional hatching direction of the diagonal sectional lines in the wells 42 and 44 in FIG. 6 represents the resulting conductivity type that dominates in the respective indicated region, as also for the sectional hatching of the surface layers 20 and 24 in FIGS. 1 to 5. In the example illustrated in FIG. 6, the first P-well 42 has been formed on the left, and the second N-well 44 has been formed on the right through the above described diffusion process 41. In that regard, the density of the cross-sectional hatch lines is in a reversed or inverse relationship relative to the concentration of the dopant atoms in the semiconductor substrate 12. While this dopant atom concentration in the original implanted surface layers 20 and 24 was still comparatively high, the concentration of the dopants has been reduced by the distribution and diffusion-spreading of the dopants through the entire volume of the semiconductor substrate 12.

The drive-in diffusion 41 in a high temperature phase is preferably carried out at such a temperature and for such a duration, until a good uniform distribution of the dopants up to the boundaries of the trench structure 34, 36 has been established. The dopant atoms that were initially positioned at interstitial lattice positions, through the diffusion have been displaced to regular lattice positions, whereby the dopant atoms are activated. This process, as well as location or position exchange processes of the atoms of the host lattice, further achieve an annealing and repairing of lattice defects or damage of the host lattice of the semiconductor substrate 12 caused by the original ion beam 18, 26 impingement.

At this stage of the process, the two wells 42 and 44 are insulated or isolated from each other by the insulating layer 14 at the bottom of the semiconductor substrate 12, and by the trench structure 34, 36 through the depth of the semiconductor substrate 12. In order to achieve a good isolation also at the upper surface of the semiconductor substrate 12, the trench structure 34, 36 is subsequently filled with an insulating or dielectric material 46, for example silicon dioxide or polysilicon. The filling of the trench structure 34, 36 through oxidation can be carried out in parallel with the diffusion 41 during the high temperature drive step for the complete drive-in diffusion of the dopant atoms into the depth of the semiconductor substrate 12.

Figure 7:
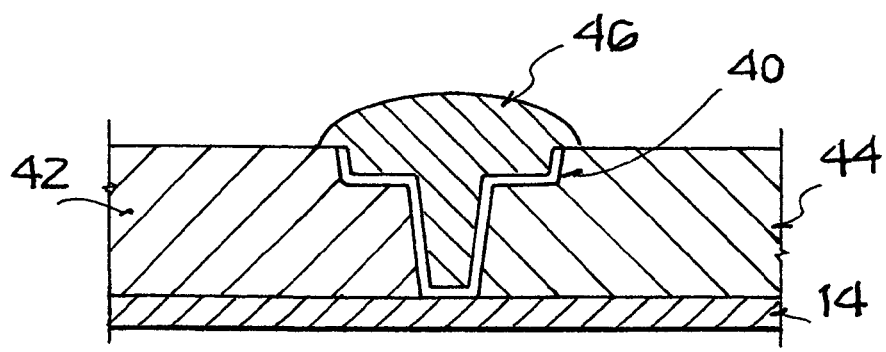
FIG. 7 shows the semiconductor substrate after the trenches have been filled with an insulating material.

The semiconductor component structure resulting from the above method steps is shown in FIG. 7. The semiconductor body 10 has two oppositely doped well regions 42 and 44 that are perfectly or completely isolated from one another by the compound trench structure 34, 36 disposed therebetween. The compound trench structure 34, 36 combines the advantages of a deep trench 36 (which provides isolation through the depth of the semiconductor substrate 12) and a shallow trench 34 (which provides isolation on the surface), as well as avoiding or reducing disadvantages such as defect generation, as discussed above. By providing a plurality of such compound trench structures 34, 36 in a suitable pattern, so-called component boxes, tubs, or pockets can thereby be defined, bounded and isolated in a wafer while. The further fabrication of active regions within the wells 42 and 44, for example for forming DMOS-transistors, can be carried out in subsequent process steps that are per se conventionally known and need not be further described herein. Basically, any conventionally known process steps can be combined, interleaved, carried out before, or carried out after the inventive process step sequence disclosed herein, in order to form any conventionally known active regions or device structures.

While the above discussed embodiment involves wells and trench structures formed through the entire depth of a semiconductor substrate to an underlying insulating layer, the inventive method can also be used to produce trench structures and wells in so-called bulk substrates. In such a case, in which the wells do not extend down to an insulating layer, the deep trenches are preferably etched to a greater depth than the depth of the wells, to ensure good isolation.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of fabricating a semiconductor component, comprising steps:
   a) forming at least one shallow trench in a semiconductor body;
   b) after said step a), forming at least one deep trench within said at least one shallow trench in said semiconductor body;
   c) providing at least one dopant; and
   d) at the earliest after said step b), driving said at least one dopant into said semiconductor body to form at least one well respectively doped with said at least one dopant in said semiconductor body;
wherein said step d) comprises a thermally supported diffusion, at an elevated temperature, of said at least one dopant into said semiconductor body to form said at least one well.

2. The method according to claim 1, further comprising forming first and second active regions in said semiconductor body such that said first and second active regions are separated from one another by said shallow trench and said deep trench.

3. The method according to claim 1, wherein said step a) comprises forming a plurality of said shallow trenches, and said step b) comprises forming a plurality of said deep trenches respectively within said shallow trenches.

4. The method according to claim 1, wherein said steps a) and b) are carried out to form said deep trench deeper and narrower than said shallow trench.

5. The method according to claim 4, wherein said steps a) and b) are carried out so that said shallow trench and said deep trench together form a compound trench having a relatively shallower and wider portion and a relatively deeper and narrower portion, and having stepped sidewalls with a shoulder at a transition between said relatively shallower and wider portion and said relatively deeper and narrower portion.

6. The method according to claim 5, wherein said stepped sidewalls slope so that said shallow trench and said deep trench taper.

7. The method according to claim 1, wherein said step c) comprises providing first and second different ones of said dopants having opposite conductivity types, and said step d) comprises forming first and second ones of said wells that are respectively doped with said first and second dopants having opposite conductivity types and that are respectively located on opposite sides of said shallow trench and said deep trench.

8. The method according to claim 1, further comprising locating and controlling said forming of said shallow trench and/or said deep trench, and/or said driving of said at least one dopant to form said at least one well, so that said well is at least partially bounded by said shallow trench and/or said deep trench.

9. The method according to claim 1, wherein said step d) involves the complete driving of said at least one dopant into said semiconductor body to form said at least one well, without any dopant drive taking place before said step d).

10. The method according to claim 1, wherein said steps b) and d) are carried out so that said deep trench has a depth at least as great as a depth of said well.

11. The method according to claim 1, wherein said semiconductor body comprises a silicon layer on an insulating layer, said step b) comprises forming said deep trench in said silicon layer to a trench depth reaching said insulating layer, and said step d) comprises forming said well in said silicon layer to a well depth reaching said insulating layer.

12. The method according to claim 1, wherein said step a) comprises carrying out an STI process to form said at least one shallow trench.

13. The method according to claim 1, wherein said step a) comprises providing on said semiconductor body a first mask with a first opening and etching said semiconductor body through said first opening to form said at least one shallow trench, and wherein said step b) comprises providing on said first mask a second mask with a second opening in registration with said first opening of said first mask and etching said semiconductor body through said second opening to form said at least one deep trench.

14. The method according to claim 13, wherein said second mask fills said shallow trench within said first opening except for said second opening so as to prevent further etching of said shallow trench during said step b).

15. The method according to claim 13, further comprising removing said first mask and said second mask before said step d).

16. The method according to claim 1, further comprising providing an insulating material in common in said shallow trench and said deep trench.

17. The method according to claim 1, further comprising providing a liner oxide layer on inner surfaces of said shallow trench and said deep trench.

18. The method according to claim 17, comprising providing said liner oxide layer before said step d).

19. The method according to claim 17, further comprising filling said shallow trench and said deep trench with an oxide or polysilicon after providing said liner oxide layer.

20. The method according to claim 1, further comprising filling said shallow trench and said deep trench with an oxide or polysilicon.

21. The method according to claim 1, wherein said step c) comprises at least one ion implantation of said at least one dopant into said semiconductor body.

22. The method according to claim 21, wherein said step c) is carried out before said step a).

23. The method according to claim 21, wherein said step c) comprises implanting said at least one dopant into at least one surface layer of said semiconductor body, and said step d) comprises said thermally supported diffusion of said at least one dopant from said at least one surface layer into an entire volume of said at least one well in said semiconductor body.

24. A method of fabricating a semiconductor component, comprising, in sequence, steps:
  a) applying at least one mask leaving first and second open areas on a semiconductor body;
  b) implanting first and second dopants of opposite polarity respectively through said first and second open areas respectively into first and second surface regions of said semiconductor body;
  c) forming a shallow trench in said semiconductor body between and/or in said first and second surface regions;
  d) forming a deep trench within said shallow trench in said semiconductor body;
  e) forming a thin oxide layer on surfaces of said shallow trench and said deep trench;
  f) by a thermally supported diffusion process, driving said first and second dopants from said first and second surface regions deeper into said semiconductor body to respectively define first and second wells respectively doped with said first and second dopants on opposite sides of said shallow trench and said deep trench in said semiconductor body; and
  g) filling said shallow trench and said deep trench with an insulating material.

25. The method according to claim 24, wherein said first and second surface regions border directly on one another in said step b), and forming said shallow trench in said step c) removes a respective portion of each of said first and second surface regions.

26. The method according to claim 1, wherein said thermally supported diffusion in said step d) drives said at least one dopant completely into said semiconductor body to form said at least one well.

27. A method of fabricating a semiconductor component, comprising steps:
  a) forming at least one shallow trench in a semiconductor body;
  b) after said step a), forming at least one deep trench within said at least one shallow trench in said semiconductor body;
  c) providing at least one dopant; and d) at the earliest after said step b), driving said at least one dopant into said semiconductor body to form at least one well respectively doped with said at least one dopant in said semiconductor body;

wherein said semiconductor body comprises a silicon layer on an insulating layer, said step b) comprises forming said deep trench in said silicon layer to a trench depth reaching said insulating layer, and said step d) comprises forming said well in said silicon layer to a well depth reaching said insulating layer.

* * * * *